(12) United States Patent
Elsherbini et al.

(10) Patent No.: US 10,033,093 B2
(45) Date of Patent: Jul. 24, 2018

(54) MMWAVE ANTENNAS AND TRANSMISSION LINES ON STANDARD SUBSTRATE MATERIALS

(71) Applicant: INTEL CORPORATION, Santa Clara, CA (US)

(72) Inventors: Adel A. Elsherbini, Chandler, AZ (US); Telesphor Kamgaing, Chandler, AZ (US); Sarah K. Haney, Cary, NC (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 14/141,830

(22) Filed: Dec. 27, 2013

(65) Prior Publication Data
US 2015/0188218 A1    Jul. 2, 2015

(51) Int. Cl.
*H01Q 1/38* (2006.01)
*H01Q 1/22* (2006.01)

(52) U.S. Cl.
CPC .............. *H01Q 1/38* (2013.01); *H01Q 1/2283* (2013.01)

(58) Field of Classification Search
CPC ................................... H01Q 1/38; H01Q 1/50
See application file for complete search history.

(56) References Cited

U.S. PATENT DOCUMENTS

| 4,063,246 A * | 12/1977 | Greiser ............... H01Q 21/065 343/700 MS |
| 6,049,308 A * | 4/2000 | Hietala ................. B82Y 10/00 343/700 MS |
| 2006/0092079 A1* | 5/2006 | de Rochemont ...... H01Q 1/362 343/700 MS |

* cited by examiner

*Primary Examiner* — Graham Smith
*Assistant Examiner* — Noel Maldonado
(74) *Attorney, Agent, or Firm* — Schwabe, Williamson & Wyatt P.C.

(57) ABSTRACT

A method including disposing a transmission line or an antenna on dielectric material; and removing a portion of the dielectric material from a region adjoining the transmission line or the antenna where the electromagnetic radiation from the transmission line or the antenna is predetermined to be greater than another portion of the dielectric material. An apparatus including a package substrate including a transmission line coupled to an antenna, the transmission line and the antenna disposed on a dielectric layer including an organic dielectric material having a first dielectric constant and a second material having a dielectric constant less than the first dielectric constant, wherein the second dielectric material adjoins a portion of the transmission line or the antenna.

8 Claims, 6 Drawing Sheets

MMWAVE ANTENNAS AND TRANSMISSION LINES ON STANDARD SUBSTRATE MATERIALS

FIELD

Millimeter wave antennas and transmission lines on substrate materials.

BACKGROUND

Millimeter wave (mmWave) radios generally require high frequency (30+ gigaHertz) transmission lines and antennas to be embedded into a package. At these high frequencies, most standard packaging material such as ABF are lossy, resulting in a significant portion of the generated power from a mmWave radio die to be dissipated inside the package rather than being radiated toward a receiver. This results in significant increase in power consumption of such radios in a transmit mode and severely limits the sensitivity in a receive mode. One solution to this problem is to use relatively expensive packaging technologies, such as low temperature co-fired ceramic (LTCC) to reduce the losses. Another solution is to use low loss substrate materials. Such materials generally are not directly compatible with mainstream organic packaging processes and require additional technology development to be incorporated. Another problem with such materials is that they commonly have a relatively high dielectric constant which require relatively thick packages to achieve a required bandwidth.

DETAILED DESCRIPTION

Figure 1:
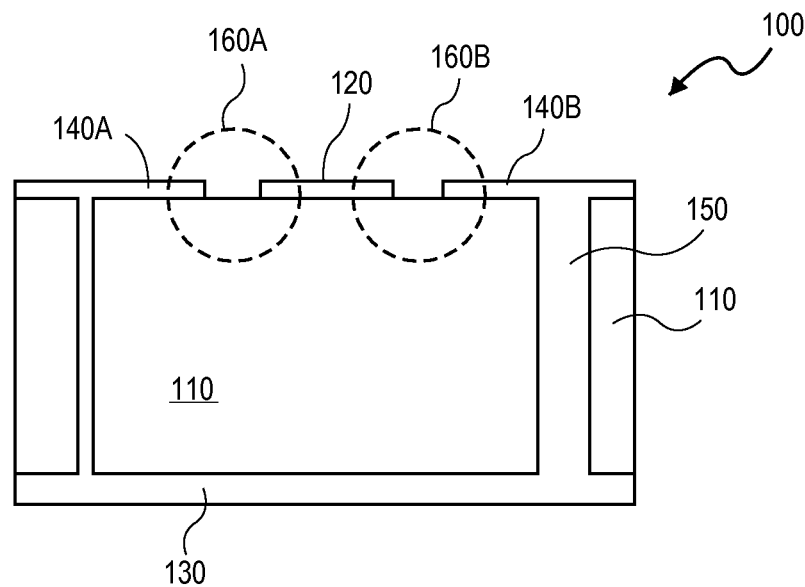
FIG. 1 shows a cross-sectional side view of a portion of a package substrate including a transmission line.

On-package antennas (e.g., phased-array antennas) are generally utilized in combination with millimeter wave (mmWave) microelectronic devices for applications that require or benefit from high speed data transmission rates over wireless links, such as the transmission of uncompressed high definition (HD) video to a wireless display device. Low dielectric constant (low-k) and low loss tangent dielectric materials are required between elements of the antennas and a ground plane within the microelectronic substrate to achieve high bandwidth, high gain, and high efficiency. In addition, the microelectronic package substrate should have transmission lines between the antenna(s) and the mmWave microelectronic devices which have low surface roughness which may result in very low energy loss per unit length, leading to either high throughput or operation at low power. Currently, the microelectronic substrates used for such microelectronic configurations are not optimized for mmWave frequencies (about 30 GHz-300 GHz). As such, achieving the electrical performance for future high performance microelectronic devices (such as system-on-chip ("SOC") devices) with integrated mmWave radios requires a re-engineering of the microelectronic substrate to increase performance.

Embodiments of the description may include a transmission line or lines and/or a high performance antenna, such as 60 GHz or greater mmWave antenna, which is fabricated on a microelectronic substrate, such as a traditional printed circuit board or package substrate. The transmission line(s) and/or antenna may be incorporated on the microelectronic substrate by forming a dielectric layer structure in the microelectronic substrate and forming the transmission line(s) and/or antenna on the dielectric layer. In one embodiment, the dielectric layer includes a combination of materials. In one embodiment, the dielectric material includes a first dielectric material that is an organic dielectric material such as ABF that is commonly used as a dielectric material in package substrate. In one embodiment, the organic dielectric material is selected for its common usages, rather than its "low loss" or low dissipation of energy. Combined with the first dielectric material of an organic dielectric material is a second material that is a low loss material. In one embodiment, the second material is air. The dielectric material layer including an organic dielectric material and air may be fabricated by forming a dielectric layer of the organic dielectric material and forming the transmission line(s) and/or antenna(s) on the dielectric layer. The dielectric layer may then be removed (e.g., etched) in areas adjoining the transmission line(s) and/or antenna(s). In one embodiment, the electromagnetic radiation field associated with transmission of a signal to or from an antenna is predicted to be highest (measured as voltage per meter) in areas of dielectric material adjoining a transmission line. Similarly, the electromagnetic radiation field associated with an antenna converting electric power into radio waves or vice versa is predicted to be highest at area of dielectric material adjoining the antenna. Therefore, in one embodiment, organic dielectric material (e.g., ABF) is removed at areas adjoining a transmission line or antenna where an electromagnetic radiation field is predicted or predetermined to be highest and replaced in these areas with air which has a relative dielectric constant of approximately one (a vacuum has a dielectric constant of one air is referenced to vacuum). In one embodiment, a structural integrity of a transmission line and/or antenna is maintained by retaining a portion of the organic dielectric material in contact with the structure while removing dielectric material in adjoining areas. Thus, embodiments of the description may enable the integration of microelectronic devices having mmWave radio on low-cost/traditional microelectronic substrates without degrading the electrical performance of the mmWave radios. It is understood that multiples of such transmission lines and antennas may be fabricated to form a phase array, such as may be required for multi-gigabits/ second wireless data transfer around 30 GHz and above.

FIG. 1 shows a cross-sectional side view of a portion of a package substrate. Package substrate 100, in this embodiment, a grounded coplanar waveguide (GCPW) transmission line is illustrated. Representatively, substrate 100 includes ground plane 130 as a metallization layer of, for example, the package substrate. Overlying ground plane 130 is dielectric layer 110. Dielectric layer 110, in one embodiment, is an organic dielectric material such as ABF. Representatively, dielectric material 110 has a thickness on the order of 10 to 200 microns. Overlying dielectric layer 110 in the embodiment illustrated in FIG. 1 is transmission line 120. Transmission line 120 in FIG. 1 is disposed between adjacent coplanar ground bar or line 140A and ground bar or line 140B. Ground bar 140A and ground bar 140B are each connected to a conductive via (conductive via 150) to ground plane 130. Accordingly, the configuration illustrated in FIG. 1 in that of a grounded coplanar waveguide (GCPW) transmission line, with transmission line (signal line) and ground bar/line on the same plane. A GCPW or a coplanar waveguide (CPW) is a commonly used transmission by a structure for millimeter (mm) Wave transmission.

FIG. 1 illustrates an operation of a GCPW transmission line in a package substrate. FIG. 1 illustrates areas of predicted or predetermined high electromagnetic radiation field by dash areas 160A and 160B associated with transmission of a signal through transmission line 120. As noted above, in general, areas of dielectric material 110 associated with area 160A or area 160B will tend to experience a greater power loss (measured in volts per meter). Accordingly, in one embodiment, to reduce the power loss through dielectric material 110, in one embodiment, areas of dielectric material 110 that are predicted or predetermined to result in the greatest power loss from transmission line 120 due to a relatively high dielectric constant and a high dissipation factor or loss tangent (Dk) associated with an organic dielectric material such as ABF (e.g., a dielectric constant of 3.3 to 7 and dissipation factor larger than 0.01) are replaced with a lower material having a lower dielectric material and/or dissipation factor. One way to replace dielectric material 110 in areas of predicted or predetermined loss is to remove the organic dielectric material in regions of predicted or predetermined high loss and replace the dielectric material with a dielectric material with a lower dielectric constant and lower dissipation factor. One choice of a dielectric material is air.

Figure 2:
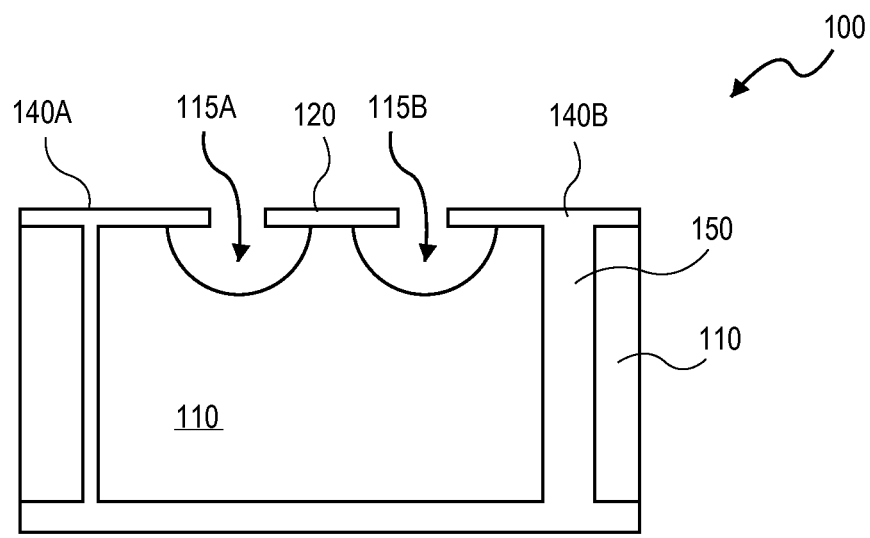
FIG. 2 shows the structure of FIG. 1 following the etching of dielectric material adjoining the transmission line.

FIG. 2 shows the structure of FIG. 1 following the etching of dielectric material 110. In one embodiment, dielectric material 110 is etched using transmission line 120 and ground bar 140A and ground bar 140B as an etchant mask. In one embodiment, a portion of dielectric material 110 is removed from a region adjoining transmission line 120. In one embodiment, such removal includes removing a portion of dielectric material 110 adjoining a length of transmission line 120 with transmission line 120 serving as a mask. In one embodiment, a portion of dielectric material that is removed includes a portion of dielectric material adjoining an entire length of the transmission line. In one embodiment, an etch is an isotropic etch. A suitable etchant to isotropically etch ABF material is an oxygen plasma. FIG. 2 illustrates the structure following the etching dielectric material adjoining opposing sides of transmission line 120. FIG. 2 shows region 115A and region 115B each disposed along a portion of transmission line 120. In an embodiment where the etch to form region 115A and region 115B is an isotropic etch which, by its nature it will proceed in directions creating the semi-circular profile illustrated in FIG. 2.

Figure 3:
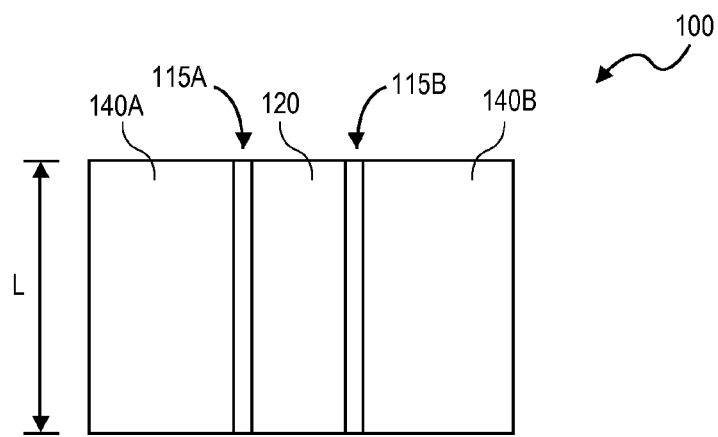
FIG. 3 shows a top view of the structure of FIG. 2.

FIG. 3 shows a top view of the structure of FIG. 2. FIG. 3 shows transmission line 120 extending a length dimension, L (e.g., between an antenna and a transmitter or receiver). Transmission line 120 is disposed between ground bar 140A and ground bar 140B. FIG. 3 illustrates region 115A and region 115B each formed along a length (e.g., an entire length) of transmission line 120.

Figure 4:
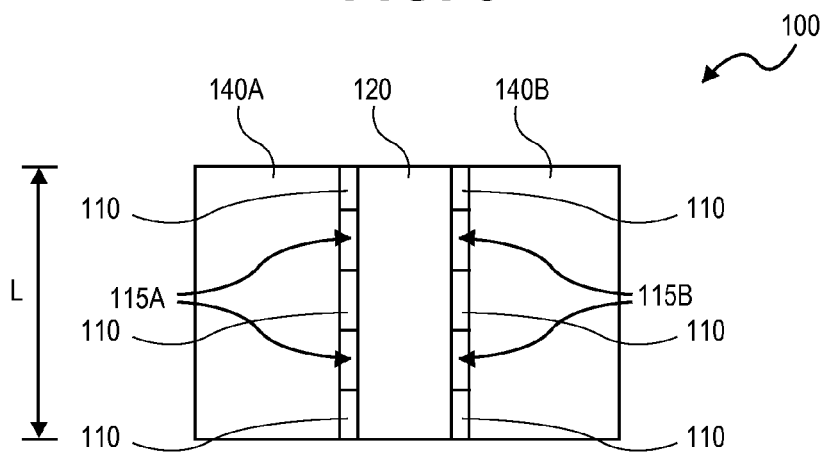
FIG. 4 shows a top view of the structure of FIG. 2 according to another embodiment.

FIG. 4 shows a top view of another embodiment of the structure of FIG. 2. In this embodiment, less than the entire portion of dielectric material 110 is removed along an entire length, L, of transmission line 120. FIG. 4 illustrates region 115A and region 115B where dielectric material (dielectric material 110) has been removed along length, L, of transmission line 120. FIG. 4 illustrates such removal is periodic. In another embodiment, it is appreciated that such removal may not be periodic and may be random.

Removing a portion of the organic dielectric material adjoining the signal line and, as illustrated in FIG. 1-4 between the signal line and side ground bars for a GCPW transmission line, region predicted or predetermined to be exposed to the greatest amount of electromagnetic radiation may be removed and replaced by a dielectric material of air which has a dielectric constant much less than a dielectric constant of the organic dielectric material. With reference to FIG. 2, the method described also provides structural support for the transmission line (transmission line 120) by retaining some of the organic dielectric material (dielectric material 110) in contact with the transmission line and supporting the transmission line. Nevertheless, by noting that the maximum electromagnetic field distribution between transmission line 120 and ground bar 140A and ground bar 140B, respectively, etching away regions of dielectric material (region 15A, region 115B) to reduce losses in the line.

Figure 5:
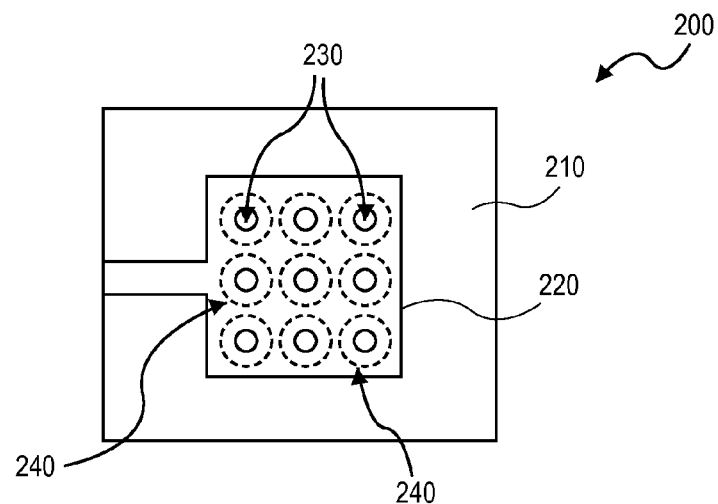
FIG. 5 shows a top view of an embodiment of a portion of the package substrate including an antenna.

FIG. 5 shows a top view of an embodiment of a portion of the package substrate 200. In this embodiment, dielectric layer 210 is, for example, an organic dielectric material, such as ABF. Overlying dielectric layer 210 in the embodiment in FIG. 5 is antenna 220. Antenna 220 is, for example, a planar antenna such as a microstrip patch antenna on a package substrate. Other type of antennas including dipoles, monopoles, Vivaldi radiators, coupled patches and slot antennas may be implemented on the package. In the illustrated embodiment, antenna 220 has a rectangular body formed of, for example, a copper material. A body of antenna 220 includes a first side and an opposite second side with, in this embodiment, a second side in contact with or adjoining dielectric layer 210. Disposed between a first side and a second side of antenna 220 are a number of openings 230. Openings 230 expose a dielectric material to dielectric planar 210. In one embodiment, to reduce power/electromagnetic field losses through dielectric layer 210 of an organic dielectric material, portions of the organic dielectric material are removed through openings 230. In one embodiment, package substrate 200 is exposed to an isotropic etchant selected for removing organic dielectric material (e.g., an oxygen plasma etch). The etch removes dielectric material through openings 230 in a body of antenna 220. In this manner, the etch removes organic dielectric material beneath openings 230. FIG. 5 shows dielectric layer 210 including regions 240 beneath openings 230 where organic dielectric material has been removed and a dielectric material of air remains. Depending on the amount of organic dielectric material that is removed, a radiation efficiency of antenna 220 (i.e., the amount of radiation power/accepted power) is improved. It is appreciated that openings 230 in antenna 220 can be of a variety of shapes (e.g., circular, square, rectangular, oval, etc.) and can be of different sizes depending, in one aspect, on a desired amount of the etch area and distribution.

FIGS. 6-12 show one embodiment of a method of forming a microelectronic package substrate using bumpless build-up layer (BBUL) technology. The method incorporates an antenna similar to antenna 220 described with reference to FIG. 5 into the package substrate.

Figure 6:
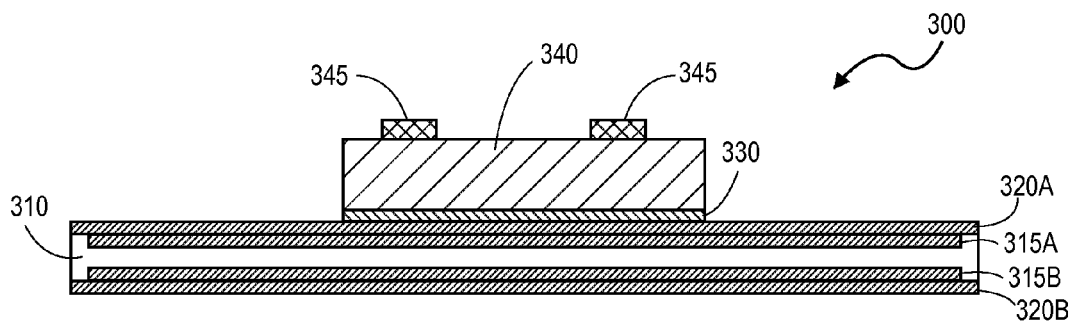
FIG. 6 shows a cross-sectional side view of a portion of sacrificial substrate including a die disposed thereon in a process to form a package assembly.

FIG. 6 shows a cross-sectional side view of a portion of sacrificial substrate 310 of, for example, a prepeg material including opposing layers of copper foils 315A and 315B that are separated from sacrificial substrate 310 by shorter copper foil layers 320A and 320B, respectively. Copper foils 315A and 315B tend to stick to the shorter foils based on vacuum. One technique in forming package assembly (one or more die and package substrate) using build-up technology is to form a package assembly on opposite sides of sacrificial substrate 310. This discussion will focus on the formation of a package assembly on one side of sacrificial substrate 310 (the "A" side). It is appreciated that a second package assembly can simultaneously or sequentially be formed on the opposite side (the "B" side).

FIG. 6 shows the structure following the mounting of die 340 on copper foil 320A. As shown in FIG. 6, die 340 is connected by adhesive 330. A suitable adhesive material for adhesive 330 is die backside film (DBF). Die 340 is positioned device side up (device side facing away from copper foil 320A). On a device side of die 340, FIG. 6 shows conductive pillars 345 connected to respective contact points of die 340. Pillars 345 may be fabricated at the die fabrication stage. Although not illustrated in FIG. 6, in one embodiment, contacts may be introduced and patterned on copper foil 320A in areas adjacent or near die 340. Such contacts may be used to connect a package assembly to a secondary die or dice or a secondary package.

Figure 7:
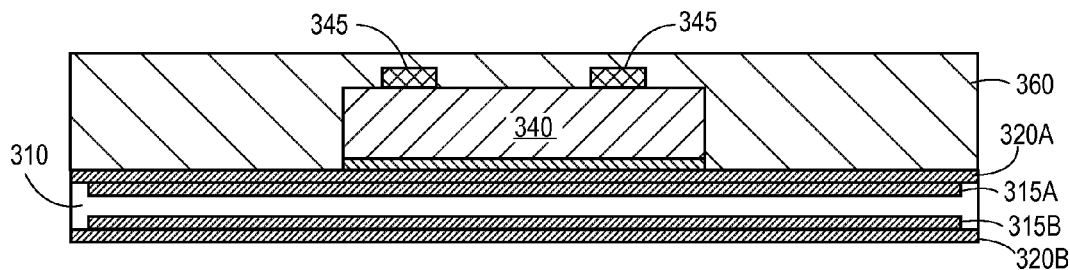
FIG. 7 shows the structure of FIG. 6 following the introduction of a dielectric layer on the structure.

FIG. 7 shows the structure of FIG. 6 following the introduction of a dielectric layer on the structure. FIG. 7 shows dielectric layer 360 of, for example, an ABF dielectric material possibly including a filler that has been described for use in forming a BBUL package. One method of introduction of an ABF material is as a film (e.g., a sheet) that is laid (laminated) on the respective die, any contacts and copper foil 320A.

Figure 8:
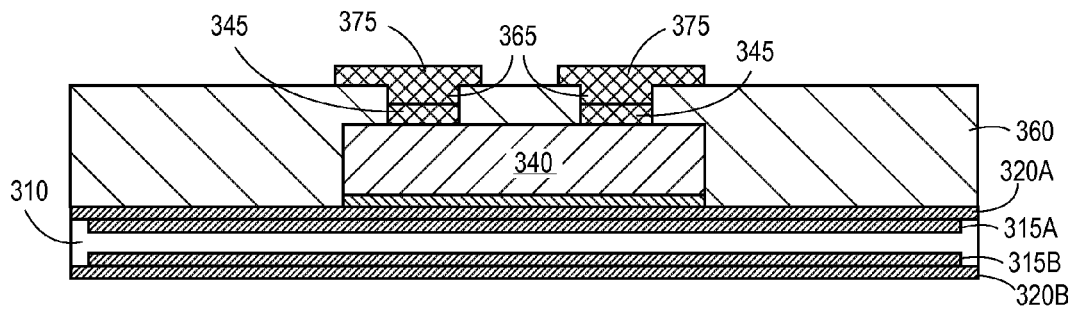
FIG. 8 also shows the structure following the patterning of a conductive line or layer on dielectric layer, and conductive vias formed through the dielectric to pillars to contact points on a device side of die.

FIG. 8 shows the structure of FIG. 7 following the opening of vias in dielectric layer 360 to pillars 345 and any contacts introduced in copper foil 320A. In one embodiment, such openings or vias may be achieved by a laser process. A desmear process may follow to clean the vias.

FIG. 8 also shows the structure following the patterning of a conductive line or layer 375 on dielectric layer 360, and conductive vias 365 formed through the dielectric to pillars 345 to contact points on a device side of die 340. In one embodiment, a surface of dielectric layer 360 and vias are seeded with a copper seed material. A mask is then introduced and patterned on dielectric layer 360. An electroplating process follows to introduce conductive vias 365 and conductive line or layer 375 of copper. Following the introduction of the electroplated copper, the mask and any undesired seed material is removed.

Figure 9:
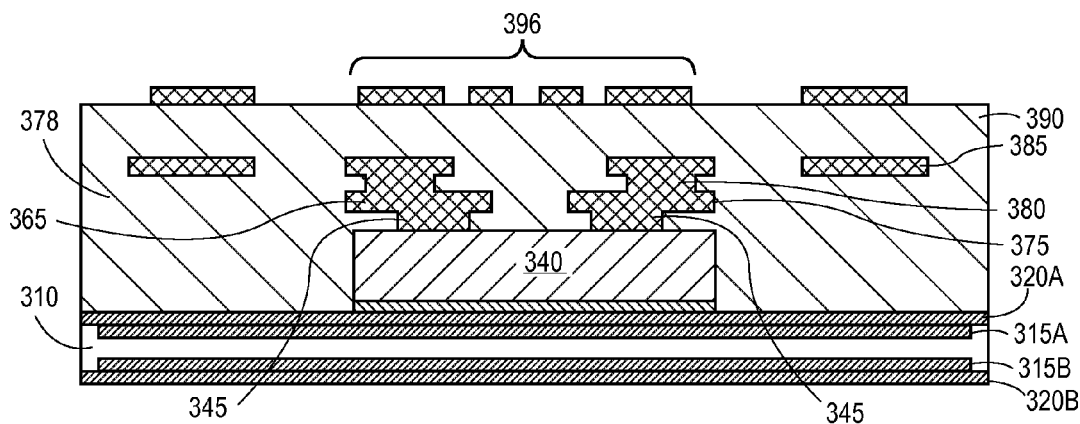
FIG. 9 shows the structure of FIG. 8 following the patterning of an additional level of conductive lines or layers.

FIG. 9 shows the structure of FIG. 8 following the patterning of an additional levels of conductive lines or layers. FIG. 9 shows conductive line or layer 385 separated from conductive layer or line 375 by dielectric layer 378 (e.g., a laminated ABF film). Conductive vias 380 are illustrated connecting line or layer 385 to line or layer 375. Conductive vias 380 and conductive line or layer 385 may be formed as described above with respect to conductive vias 365 and conductive line or layer 375. In one embodiment, conductive layer or line 385 includes a ground plane for mmWave components such as transmission line(s) and/or antenna(s). A typical BBUL package may have four to six levels of conductive lines or traces similar to conductive lines or layers 375 and 385 separated from adjacent lines by dielectric material (e.g., ABF film). Connections between the layers is made, in one embodiment, by conductive vias (e.g., copper filled vias) formed by laser drilling the vias and depositing a conductive material in the vias. FIG. 9 shows the structure following the introduction and patterning of conductive line or layer 395 as an ultimate or top level of the package substrate body. Conductive line or layer 395 is introduced and patterned on dielectric layer 390 of, for example, an ABF material (an organic dielectric material). In this embodiment, conductive line or layer 395 is introduced and patterned to include one or more antenna and one or more transmission lines to an antenna(s).

Figure 10:
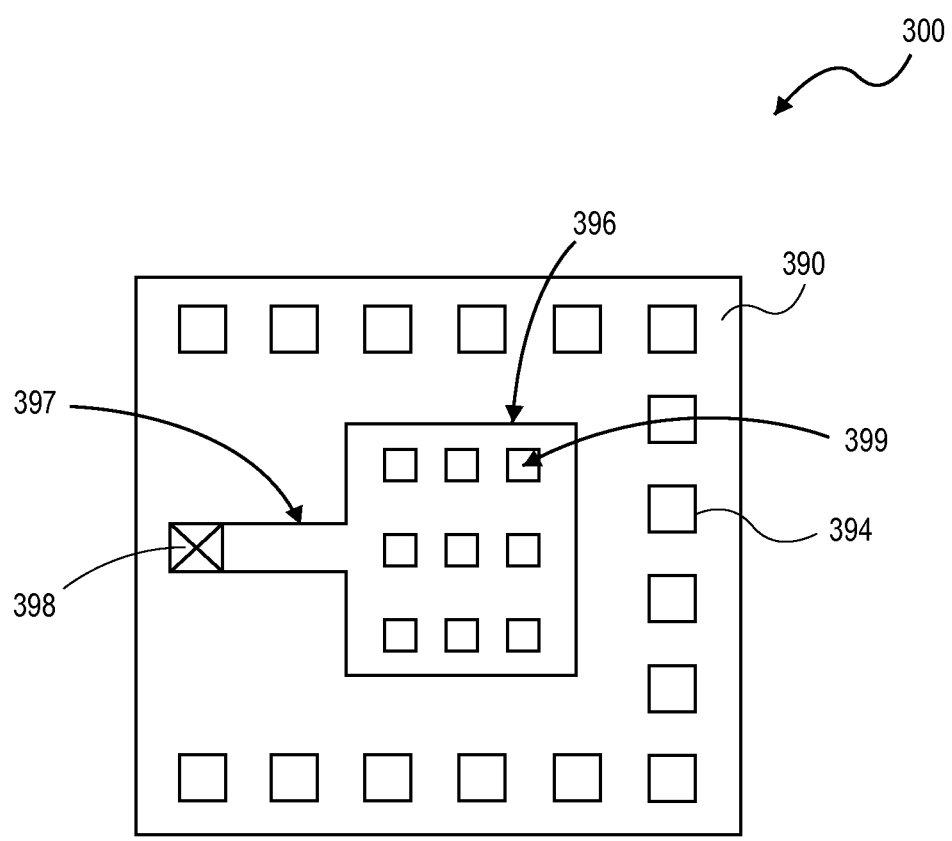
FIG. 10 shows a top view of the structure of FIG. 9.

FIG. 10 shows a top view of the structure of FIG. 9. In this view, a portion of the package assembly is shown. The portion includes antenna 396 and transmission line 397 patterned as a portion of conductive line or layer 395. FIG. 10 also illustrates conductive vias connecting transmission line 397 to a lower level of the package substrate. In one embodiment, conductive line or layer 395 is electroplated copper introduced as described above with respect to conductive line or layer 375. Representatively, vias to an underlying conductive layer are introduced by laser drilling and cleaned by desmearing. The surface of dielectric layer 390 and the vias are seeded with a copper seed material. A surface of the structure is then masked using, for example, photolithographic techniques to produce a mask of photoresist material having openings that define an area for antenna 396, transmission line 397 and contact pads 394. With respect to masking an area for antenna 396, in one embodiment, portions of an area for a desired antenna body are periodically masked and portions are not masked so that the body will be defined by the unmasked area and openings through the body by the masked areas. Following masking, a copper material is introduced to the exposed areas by, for example, a plating process. Following the plating process, the mask and unwanted seed material are removed.

FIG. 10 shows antenna 396 as a planar rectangular body with one side adjoining or in contact with dielectric layer 390 and an opposite side defining a top portion of package assembly 300. Antenna 396 has a number of openings 399 between the first and second side. In one embodiment, the openings were created by masked areas in the masking operation described above. Openings 399 are illustrated as rectangular. It is appreciated that such openings may be other shapes (e.g., circular, oval). FIG. 10 also shows transmission line 397 having a surface adjoining or in contact with dielectric layer 390 and an opposing surface defining a top portion of package assembly 300.

Figure 11:
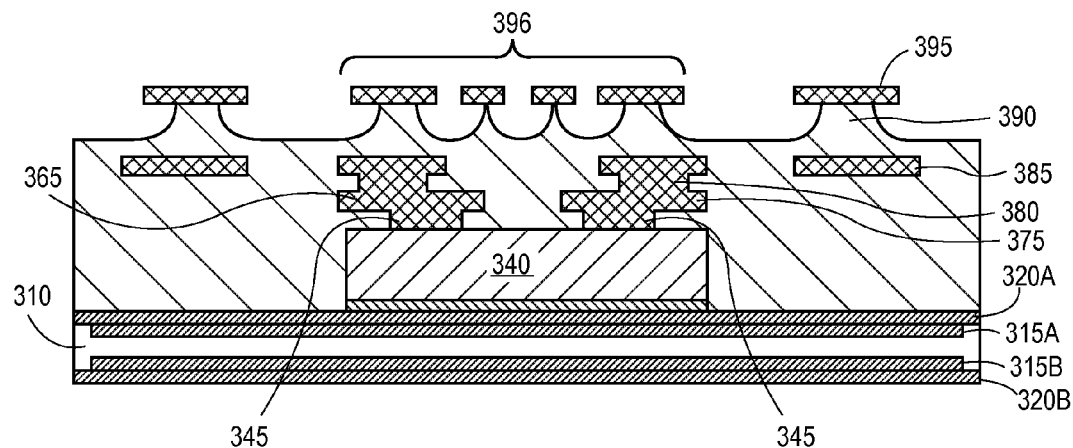
FIG. 11 shows the structure of FIG. 10 following the removal of portions of dielectric material in regions adjoining antenna and transmission line.
Figure 12:
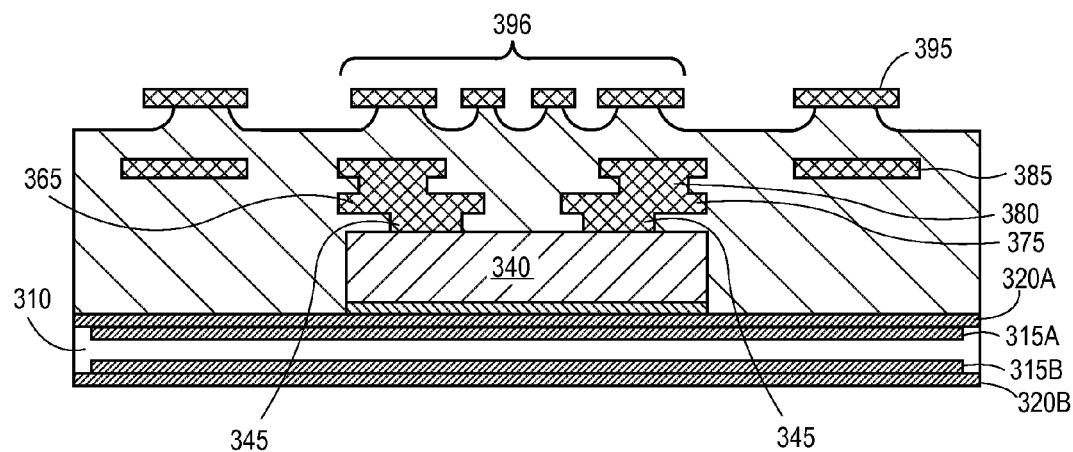
FIG. 12 shows the structure of FIG. 10 according to another embodiment with a less aggressive dielectric removal than the process to form the structure shown in FIG. 11.

FIG. 11 shows the structure of FIG. 9 following the removal of portions of dielectric material 390 in regions adjoining antenna 396 and transmission line 397. In one embodiment, dielectric material is removed by an isotropic etch process. A representative etchant to isotropically etch ABF material is an oxygen plasma etch. The isotropic etch process will tend to remove adjoining dielectric material beneath antenna 396 and transmission line 397 as shown in FIG. 11. Dielectric material is removed beneath antenna 396 by etching through openings 399 in the antenna body. In one embodiment, the antenna body is used as an etch mask. In an embodiment to etch dielectric material adjoining and adjacent to transmission line 397, a mask may be introduced on the structure. Alternatively, in an embodiment including coplanar ground lines or bars adjacent opposing lateral sides of transmission line 397, the transmission line and the coplanar ground lines or bars may serve as an etch mask (see FIGS. 1-4). FIG. 11 shows an etch process that aggressively removes adjoining dielectric material. FIG. 12 shows the same structure with a less aggressive dielectric removal. A radiation efficiency of antenna 396 can be improved depending on the amount of dielectric material removed. In one embodiment, antenna 396 will have a better radiation efficiency with the removal of more dielectric material (FIG. 11) than less (FIG. 12). As illustrated in each of FIG. 11 and FIG. 12, following the etch process, the antenna and conductive line are supported by dielectric material.

Following etching of dielectric layer 390, a passivation material may be introduced. In one embodiment, a thin layer of silicon dioxide or a polymer protection film can be deposited on the substrate to passivate the substrate. A representative thickness is on the order of a few hundred nanometers to a few microns. The assembly may further be processed as desired for a BBUL package assembly. Following processing, the BBUL package assembly is separated from substrate 310 and foils 320A and 315A.

Figure 13:
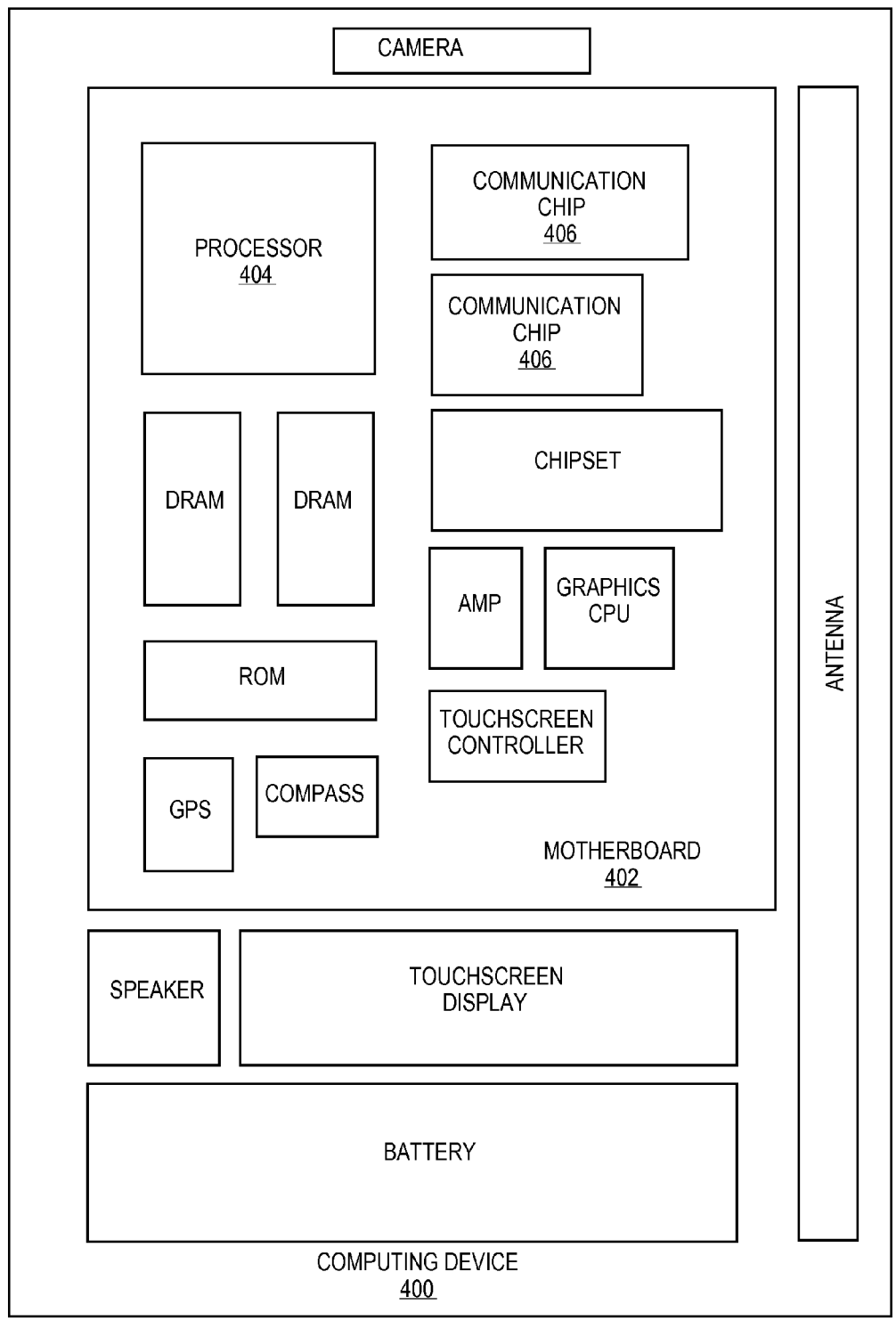
FIG. 13 illustrates a computing device in accordance with one implementation.

FIG. 13 illustrates a computing device 400 in accordance with one implementation. Computing device 400 houses board 402. Board 402 may include a number of components, including but not limited to processor 404 and at least one communication chip 406. Processor 404 is physically and electrically coupled to board 402. In some implementations the at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to WiGig, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the package formed in accordance with embodiment described above utilizes BBUL technology with a package substrate including transmission line(s) and antenna(s) as described above suitable for mmWave applications. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, package is based on BBUL technology and incorporates a package substrate including transmission line(s) and antenna(s) as described above suitable for mmWave applications.

In further implementations, another component housed within computing device 400 may contain a microelectronic package that incorporates a primary BBUL carrier implementation such as described above.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the claims but to illustrate it. The scope of the claims is not to be determined by the specific examples provided above. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
disposing of a transmission line on an organic dielectric material on a microelectronic package substrate; and
retaining a portion of the dielectric material on which the transmission line is disposed while removing a portion of the dielectric material from a region adjoining the transmission line where the electromagnetic radiation from the transmission line is predetermined to be greater than another portion of the dielectric material,
wherein the package substrate comprises a die mounted thereto.

2. The method of claim 1, wherein removing a portion of the dielectric material from a region adjoining a transmission line comprises removing a portion of the dielectric material adjoining a length of the transmission line with the transmission line serving as a mask.

3. The method of claim 2, wherein etching comprises etching the dielectric material adjoining opposing sides of the transmission line.

4. The method of claim 3, wherein the transmission line is disposed between two coplanar ground planes.

5. The method of claim 2, wherein etching comprises isotropic etching.

6. The method of claim 2, wherein removing a portion of the dielectric material adjoining the length of the transmission line comprises removing less than the entire portion adjoining the length.

7. The method of claim 6, wherein removing comprises periodically removing dielectric material along the length.

8. The method of claim 1, wherein after removing a portion of the dielectric material from a region adjoining the transmission line, the method comprises passivating the substrate with a dielectric material.

* * * * *